(12) United States Patent
Bao et al.

(10) Patent No.: US 10,147,725 B2
(45) Date of Patent: Dec. 4, 2018

(54) FORMING MOSFET STRUCTURES WITH WORK FUNCTION MODIFICATION

(71) Applicant: International Business Machines Corporation, Armonk, NY (US)

(72) Inventors: Ruqiang Bao, Niskayuna, NY (US); Gauri Karve, Cohoes, NY (US); Derrick Liu, Albany, NY (US); Robert R. Robison, Colchester, VT (US); Gen Tsutsui, Delmar, NY (US); Reinaldo A. Vega, Mahopac, NY (US); Koji Watanabe, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 20 days.

(21) Appl. No.: 14/968,134

(22) Filed: Dec. 14, 2015

(65) Prior Publication Data

US 2017/0133272 A1    May 11, 2017

Related U.S. Application Data

(63) Continuation of application No. 14/934,758, filed on Nov. 6, 2015.

(51) Int. Cl.
   *H01L 21/8234*   (2006.01)
   *H01L 27/092*    (2006.01)
   (Continued)

(52) U.S. Cl.
   CPC .... *H01L 27/0922* (2013.01); *H01L 21/02192* (2013.01); *H01L 21/82345* (2013.01);
   (Continued)

(58) Field of Classification Search
   CPC .......... H01L 27/0922; H01L 21/02192; H01L 21/82345; H01L 29/16; H01L 29/161;
   (Continued)

(56) References Cited

PUBLICATIONS

Bao et al., "Forming MOSFET Structures With Work Function Modification," U.S. Appl. No. 14/934,758, filed Nov. 6, 2015.
(Continued)

*Primary Examiner* — Victor A Mandala
*Assistant Examiner* — Colleen E Snow
(74) *Attorney, Agent, or Firm* — Cantor Colburn LLP; Vazken Alexanian

(57) ABSTRACT

A method of making a semiconductor device comprises forming a first channel region comprising a first channel region material and a second channel region comprising a second channel region material; disposing a gate dielectric on the first channel region and second channel region; depositing a work function modifying material on the gate dielectric; disposing a mask over the work function modifying material deposited on the gate dielectric disposed on the first channel region; removing the work function modifying material from the unmasked gate dielectric disposed on the second channel region; removing the mask from the work function modifying material deposited on the gate dielectric disposed on the first channel region; forming a first gate electrode on the work function modifying material deposited on the first channel region and forming a second gate electrode on the gate dielectric disposed on the second channel region.

7 Claims, 18 Drawing Sheets

(51) Int. Cl.
    *H01L 29/49*         (2006.01)
    *H01L 29/161*       (2006.01)
    *H01L 29/16*         (2006.01)
    *H01L 21/02*         (2006.01)
    *H01L 29/40*         (2006.01)

(52) U.S. Cl.
    CPC ............ *H01L 29/16* (2013.01); *H01L 29/161* (2013.01); *H01L 29/401* (2013.01); *H01L 29/4958* (2013.01); *H01L 29/4966* (2013.01)

(58) Field of Classification Search
    CPC ............... H01L 29/401; H01L 29/4958; H01L 29/4966
    See application file for complete search history.

(56) References Cited

PUBLICATIONS

List of IBM Patents or Patent Applications Treated as Related; YOR920151129US2, Date Filed: Dec. 14, 2015, pp. 1-2.

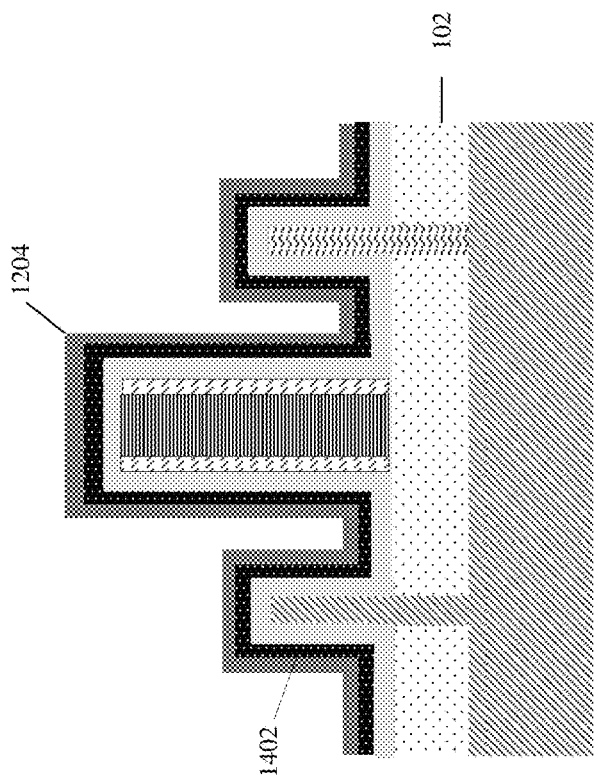
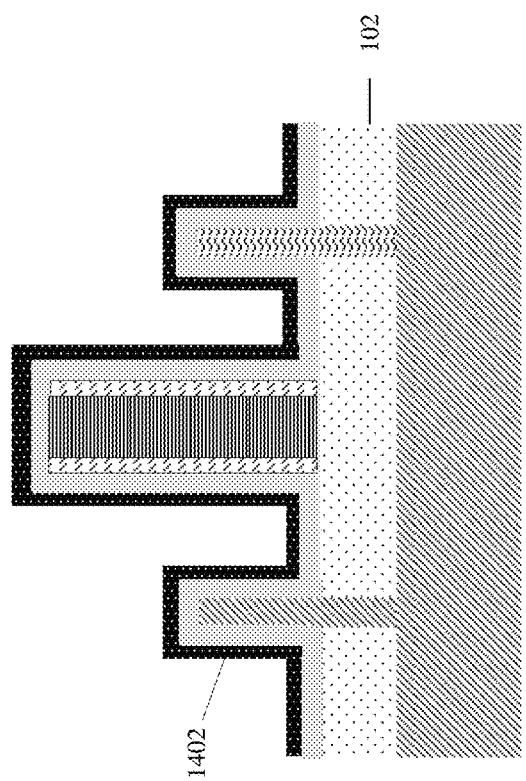

FORMING MOSFET STRUCTURES WITH WORK FUNCTION MODIFICATION

BACKGROUND

The present invention relates to metal-oxide-semiconductor field-effect transistors (MOSFET), and more specifically, to providing more undoped threshold voltages in MOSFETs.

The MOSFET is a transistor used for amplifying or switching electronic signals. The MOSFET has a source, a drain, and a metal oxide gate electrode. The metal gate is electrically insulated from the main semiconductor n-channel region or p-channel region by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

SUMMARY

According to an embodiment of the present invention, a method of making a semiconductor device comprises forming a first channel region comprising a first channel region material and a second channel region comprising a second channel region material; disposing a gate dielectric on the first channel region and second channel region; depositing a work function modifying material on the gate dielectric disposed on the first channel region and the second channel region; disposing a mask over the work function modifying material deposited on the gate dielectric disposed on the first channel region; removing the work function modifying material from the unmasked gate dielectric disposed on the second channel region; removing the mask from the work function modifying material deposited on the gate dielectric disposed on the first channel region; forming a first gate electrode on the work function modifying material deposited on the first channel region and forming a second gate electrode on the gate dielectric disposed on the second channel region.

According to another embodiment, a method of making a semiconductor device comprises forming a first channel region comprising a first channel region material and a second channel region comprising a second channel region material; disposing a gate dielectric on the first channel region and second channel; forming a first gate electrode on the gate dielectric disposed on the first channel region and forming a second gate electrode on the gate dielectric disposed on the second channel; depositing a work function modifying material on the first gate electrode and the second gate electrode; disposing a mask on the work function modifying material deposited on the first gate electrode; removing the work function modifying material deposited on the second gate electrode; and removing the mask from the work function modifying material deposited on the first gate electrode.

Yet, according to another embodiment, a semiconductor device comprises a first transistor of a first type comprising a first channel region material and a first gate electrode and a second transistor type comprising a second channel region material and a second gate electrode, wherein the first and second gate electrodes comprise a work function material and further wherein the first gate electrode comprises a work function modifying material.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 17A and 17B are cut away views after deposition of the work function modifying material.

DETAILED DESCRIPTION

Figure 1:
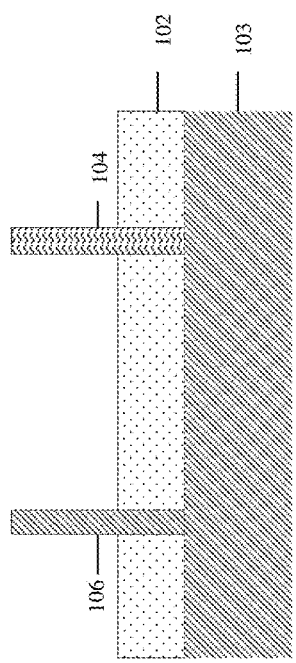
FIG. 1 is a side view of two fins on a substrate

There is an increasing demand for multiple threshold voltage offerings in semiconductor technology. For a given semiconductor technology, a device menu exists comprising low threshold voltage and high threshold voltage devices, for each of the nFET and pFET. Circuit design optimization may require more than two threshold voltage offerings, in which case, more granularity in the threshold voltage offering is desired between the highest and lowest threshold voltage devices in the device menu. This demand can be met through several approaches, most typically involving channel doping. However, channel doping degrades mobility and increases threshold voltage variability. It is desirable to satisfy as many threshold voltage requirements as possible without requiring channel doping.

Accordingly, embodiments of the present invention provide methods of making semiconductor devices with multiple threshold voltages without doping. The method comprises using a work function modifying material in combination with the gate electrode to achieve a work function different from the gate electrode alone. Combinations of channel region material, gate electrode material and work function modifying material can result in a wide range of threshold voltages in a device menu. For example, by choosing a pFET channel region material which has a valence band edge shift towards the conduction band edge of the nFET channel region material then the pFET gate work function required to achieve a specific threshold voltage, or off-state leakage current (e.g., the lowest pFET threshold voltage, which results in the highest off-state leakage current), approaches the nFET gate work functions utilized in the device menu. If the valence band edge shift is large enough, then the pFET gate work function will have a value in between the nFET gate work functions used for the highest and lowest nFET threshold voltages. This results in interdigitation of the pFET and nFET gate work functions, thereby permitting sharing of the pFET gate work functions with the nFET and vice versa. Traditionally, each of the nFET and pFET have an exclusive work function, which may furthermore employ a work function modifying material to change (typically to reduce) the work function value. Thus, the low threshold voltage nFET has a nFET work function material with a work function modifying material, while the high threshold voltage nFET has the same nFET work function material but without the work function modifying material. Correspondingly, the low threshold voltage pFET has a pFET work function material, while the high threshold voltage pFET has the same pFET work function material but with the work function modifying material. This differs from the aforementioned traditional approach in that it enables sharing of the nFET and pFET work function materials across both of the nFET and pFET, such that no single work function material, either with or without the work function modifying material, is exclusively used on either of the nFET or pFET.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1-17 illustrate exemplary methods for fabricating a semiconductor device having multiple threshold voltages. The illustrated exemplary methods are but two methods for fabricating the device.

Referring to FIG. 1 illustrates a side view of two semiconductor fins on a wafer. The wafer includes a bulk semiconducting material, upon which an insulating layer (e.g., an oxide layer) is disposed between the semiconductor fins. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

The structure of FIG. 1 includes an insulator layer 102, a first semiconductor fin 104 and a second semiconductor fin 106 disposed on the substrate 103. The insulator layer 102 is disposed between the fins. The second semiconductor fin comprises the same material as the substrate. The first semiconductor fin comprises a different material than the second semiconductor fin. In some embodiments the first semiconductor fin has a valence band edge that is dissimilar from a valence band edge of the second semiconductor fin. For example, the second semiconductor can be silicon and the first semiconductor can be silicon germanium. In some embodiments the first semiconductor has a conduction band edge that is dissimilar from a conduction band edge of the second semiconductor.

Figure 2:
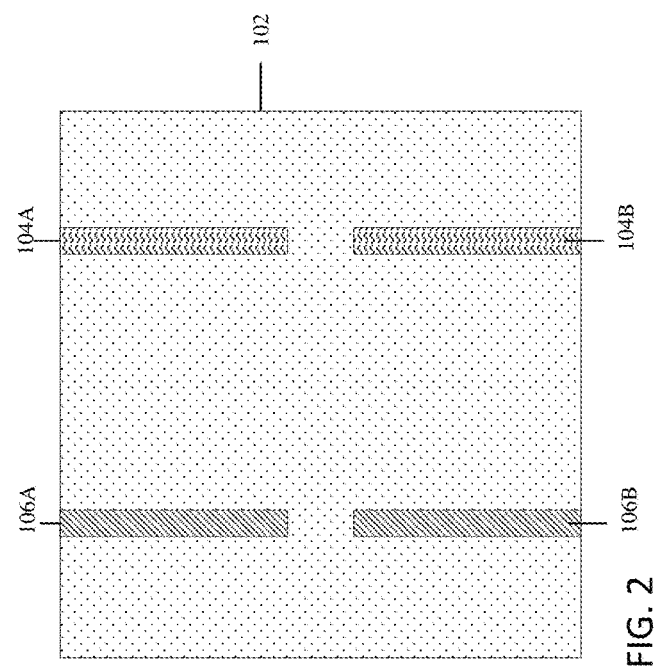
FIG. 2 is a top view of two fins on a substrate.

FIG. 2 illustrates a top view of the fin structure shown in FIG. 1. FIG. 2 shows that the first semiconductor fin and the second semiconductor fin are discontinuous.

Figure 3:
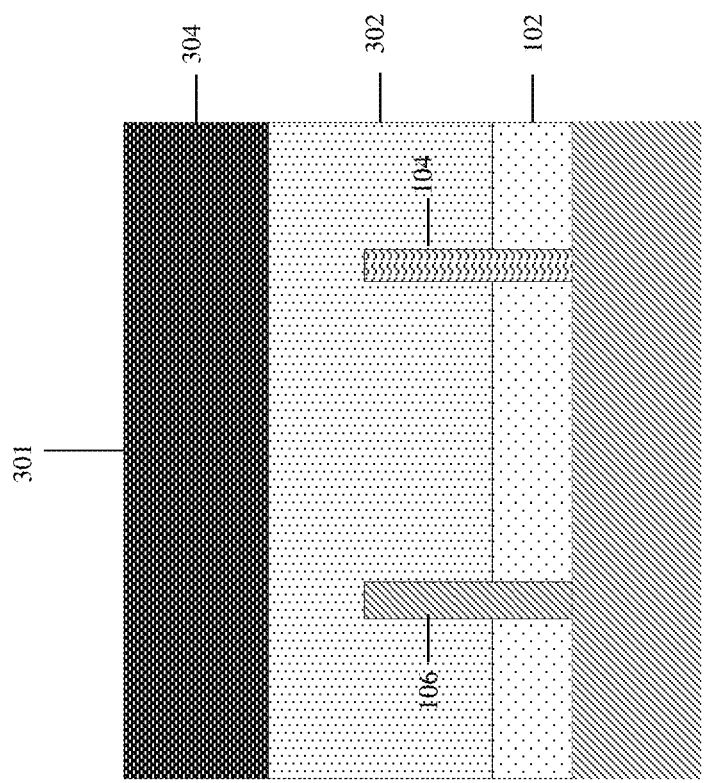
FIG. 3 shows a dummy gate stack.

FIG. 3 illustrates a side view of the resultant structure following the deposition of a layer of dummy gate (sacrificial gate) material 302 that may include, for example, a polysilicon material an oxide material, or a combination thereof. Following the deposition of the layer of dummy gate material 302, a hard mask material 304 is deposited on the dummy gate material 302.

Following the deposition of the hard mask material 304, a patterning and etching process is performed to remove portions of the hard mask material 304 and the dummy gate material 302 to expose portions of the insulator layer 102 and form dummy gate stacks 301a and 301b.

Figure 4:
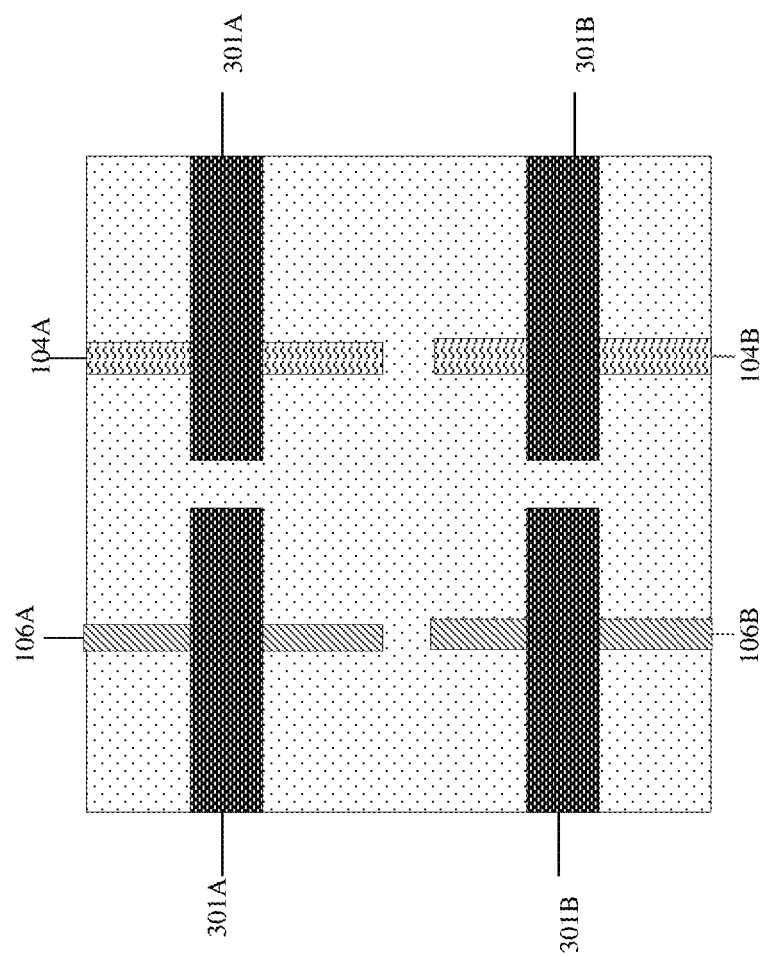
FIG. 4 is a top view showing two dummy gate stacks.

FIG. 4 illustrates a top view of the dummy gate stacks 301 arranged on the insulator layer 102. The dummy gate stacks 301 include dummy gate stack 301a and dummy gate stack 301b.

Figure 5:
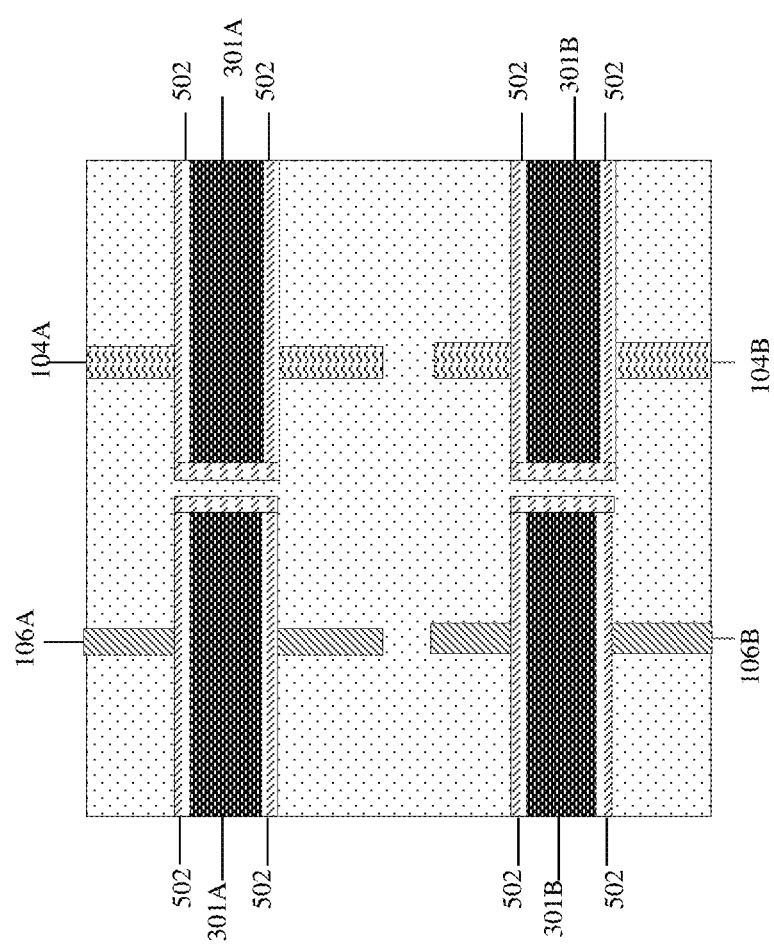
FIG. 5 is a top view showing two dummy gate stacks with side walls.

FIG. 5 illustrates a top view following the formation of sidewall spacers 502 adjacent to the dummy gate stacks 301. The spacers 502 are formed from a spacer material. The spacer material may contain Si, N, and at least one element selected from the group consisting of C and B. Additionally, the spacer material may contain Si, N, B, and C. For example, the spacer material may include SiN, SiBN, SiCN, SiBCN, or any combination thereof. The spacers 502 are formed by depositing a layer of the spacer material and performing an anisotropic etching process such as, for example, reactive ion etching that forms the resultant spacers 502.

Figure 6:
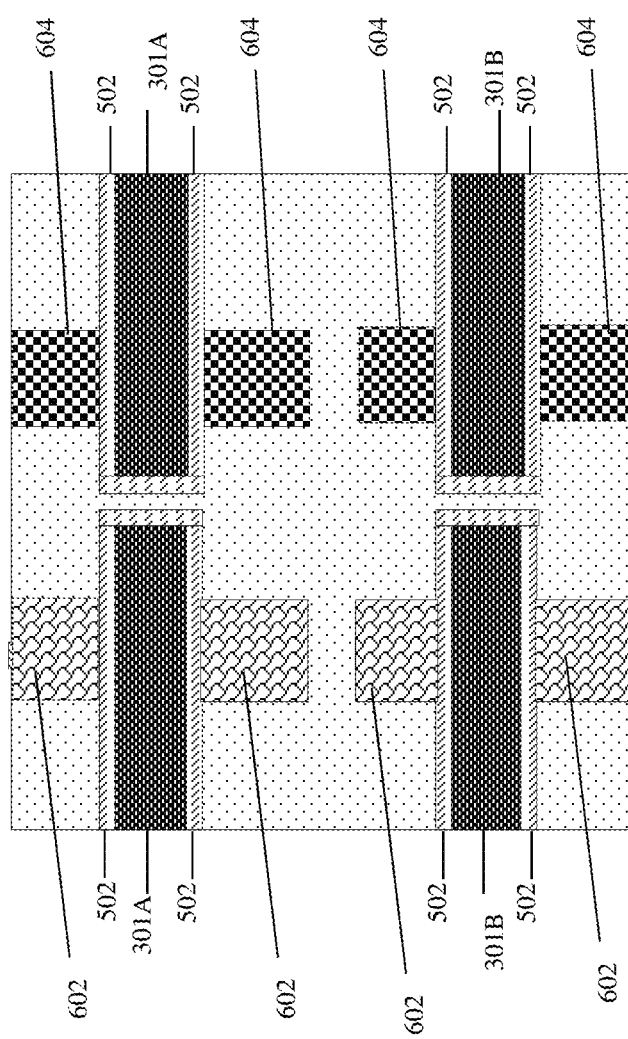
FIG. 6 is a top view showing the dummy gate stacks with source/drain materials in place.

FIG. 6 illustrates a top view of following the formation of a first source/drain region 602 and a second source/drain region 604 on the semiconductor fins 106 and 104. The source/drain regions of the illustrated embodiment are formed by an epitaxial growth process. The first source/drain region and the second source/drain region are of different types. For example one is p-type and the other is n-type. The first source/drain region and the second source/drain region are formed separately by a masked process and FIG. 6 depicts the results of that process.

An epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium).

Figure 7:
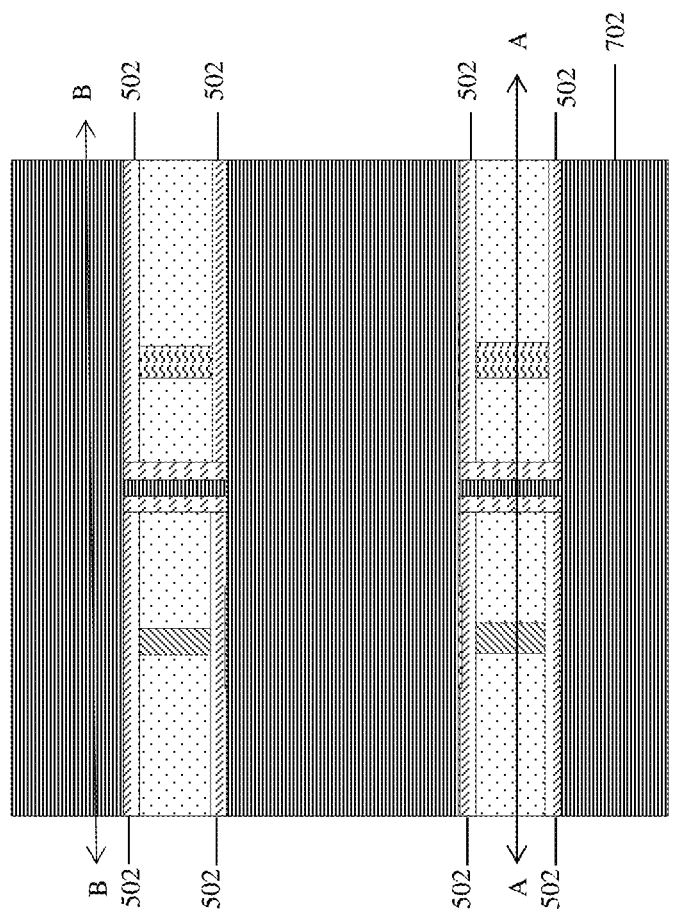
FIG. 7 is a top view showing the dummy gate stacks removed.

FIG. 7 illustrates a top view of the resultant structure following the deposition of an insulator layer 702 that may include, for example, an oxide material over exposed portions of the source/drain regions 602 and 604 (of FIG. 6) and portions of the insulator layer 102, and the removal of the dummy gate stacks 301 (of FIG. 4). The removal of the dummy gate stacks 301 exposes channel regions of the fins 104 and 106 (of FIG. 2). The dummy gate stacks 301 may be removed by any suitable selective etching process.

Figure 8:
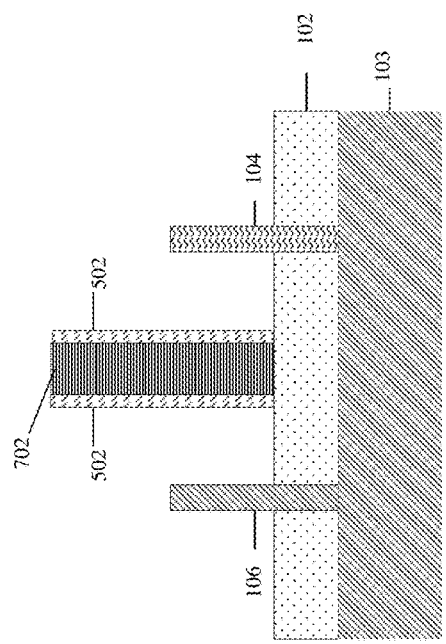
FIG. 8 is a cut away view along line A-A of FIG. 7.

FIG. 8 illustrates a cut-away view along the line A-A of FIG. 7. Referring to FIG. 8, the insulator layer 102 and the substrate 103 is shown with the fins 104 and 106.

Figure 9:
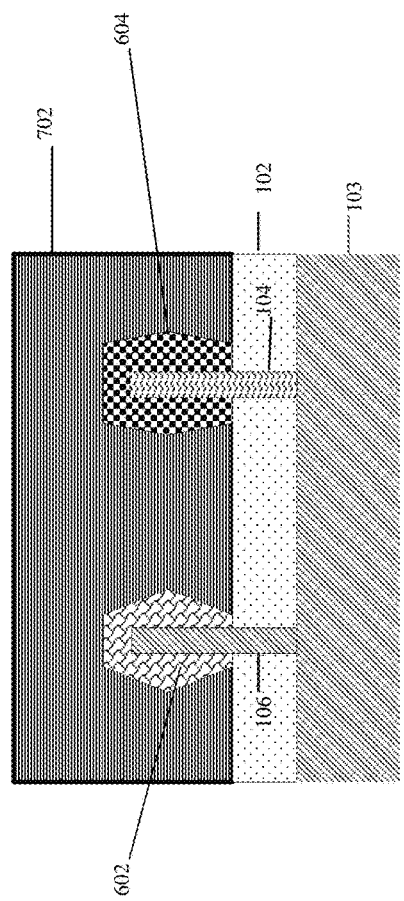
FIG. 9 is a cut away view along line B-B of FIG. 7

FIG. 9 illustrates a cut-away view along the line B-B of FIG. 7. The semiconductor fins are shown with the source/drain regions 602 and 604 grown over the fins 104 and 106. The insulator layer 702 is disposed over the source/drain regions 602 and 604.

Figure 10:
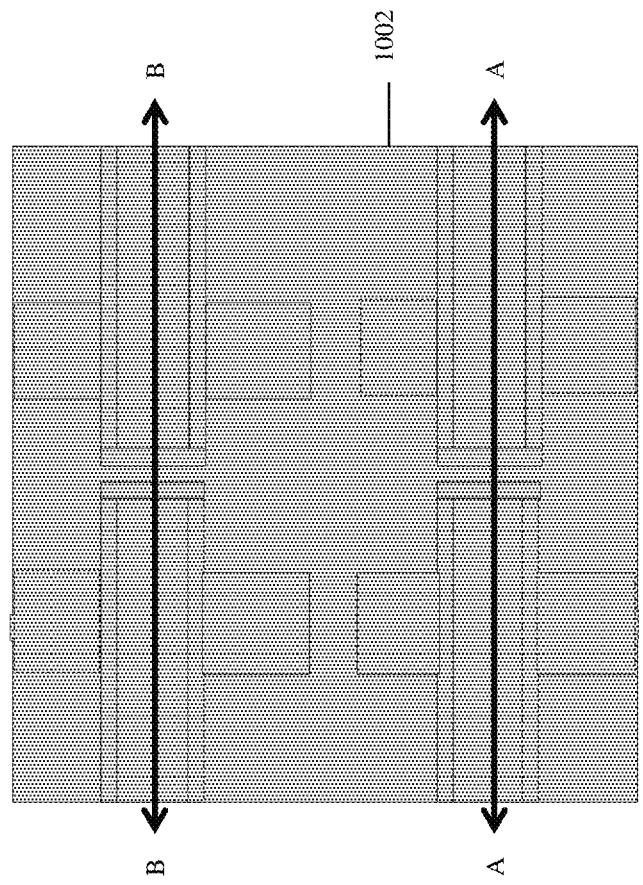
FIG. 10 is a top view after the deposition of the high k dielectric.

FIG. 10 illustrates a top view of the resultant structure following the deposition of a formation of a high-k dielectric layer 1002. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum. The high-k dielectric layer 1002 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Figure 11A:
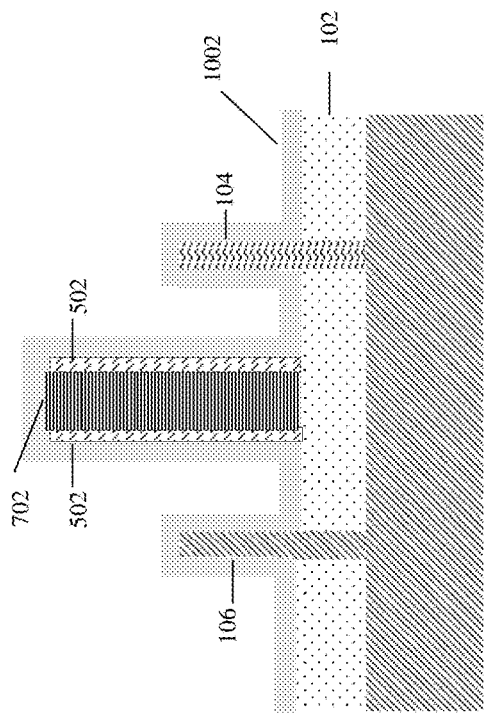
FIG. 11A is a cut away view along line A-A of FIG. 10.
Figure 11B:
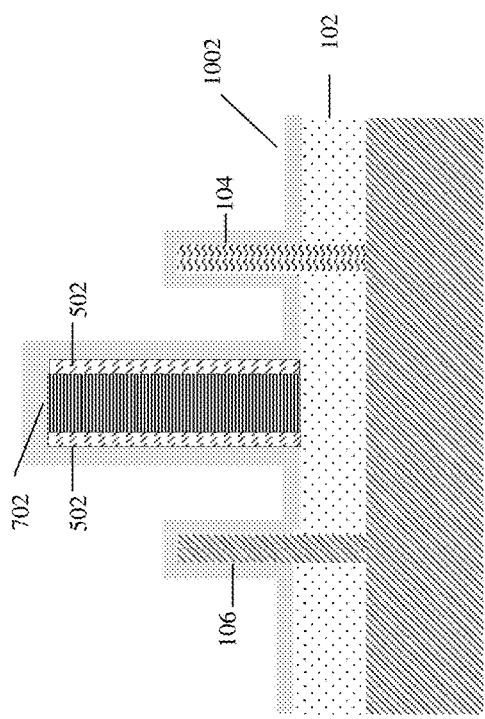
FIG. 11B is a cut away view along line B-B of FIG. 10.

FIG. 11A illustrates a cut-away view along the line A-A of FIG. 10. FIG. 11B illustrates a cut-away view along the line B-B of FIG. 10. Referring to FIG. 10, the dielectric material layer 1002 is formed over exposed portions of the insulator layer 102 and the semiconductor fins 104 and 106.

Figure 12:
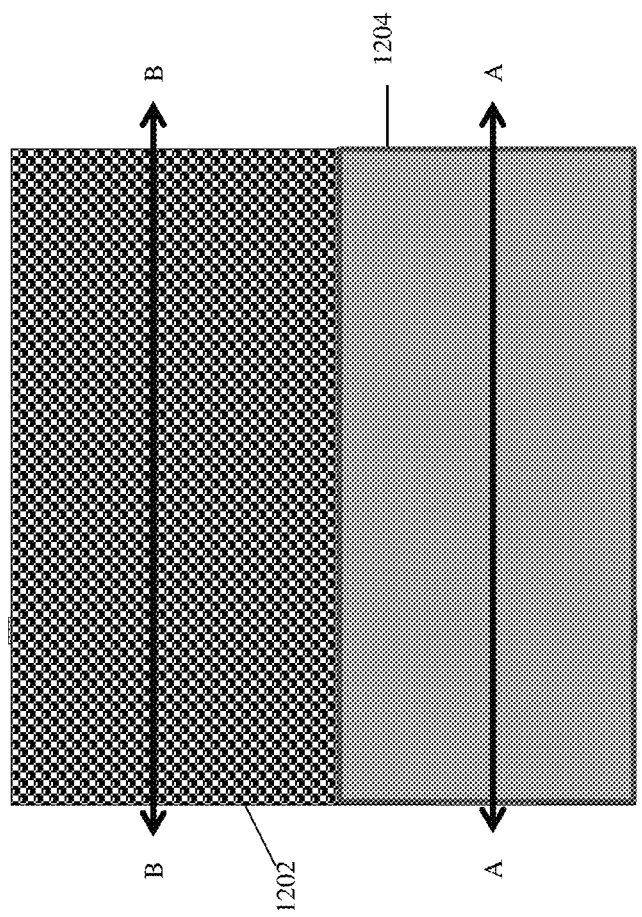
FIG. 12 shows a mask on a portion of the device of FIG. 10.

A work function modifying material is applied over the dielectric layer. A mask is then applied to the region where the work function modifying material is to be retained and the work function modifying material is removed from the unmasked region. FIG. 12 illustrates a top view following the formation of a mask 1202 over a portion of the work function modifying material 1204. It is also contemplated that the mask may be applied such that the work function modifying material may be removed from all areas except between the side walls of 104a and 106a. Exemplary work function modifying materials include lanthanum oxide.

Figure 13B:
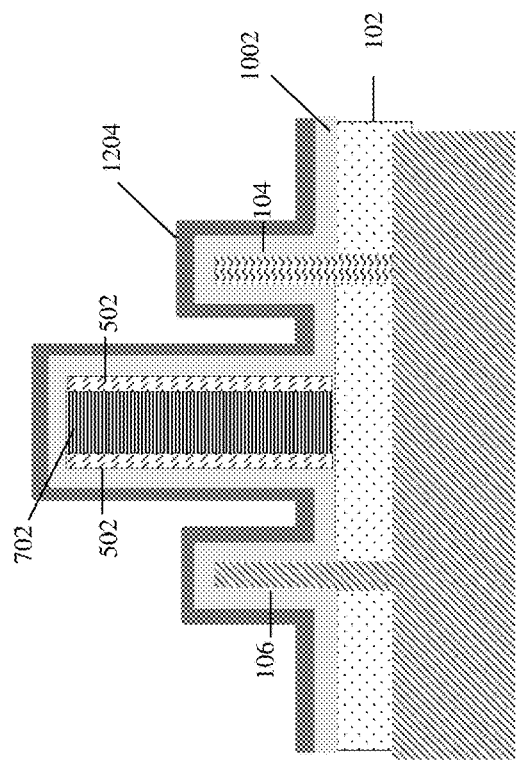
FIG. 13B is a cut away view along line B-B of FIG. 12 after deposition of the work function modifying material.
Figure 13A:
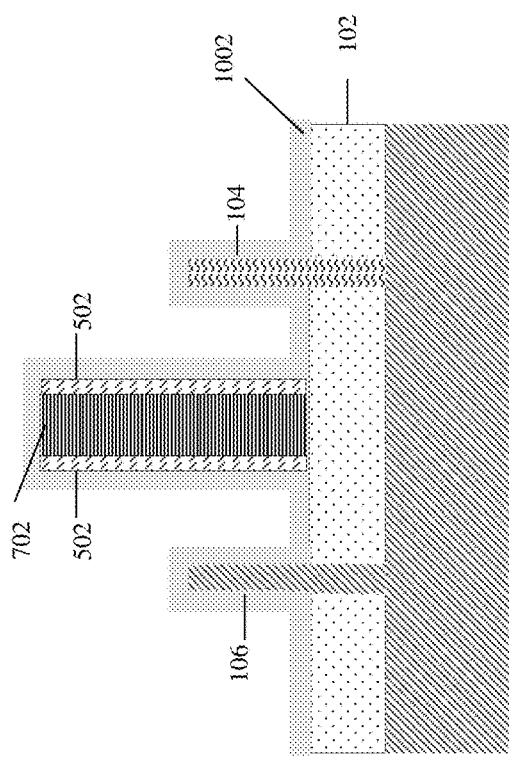
FIG. 13A is a cut away view along line A-A of FIG. 12 after deposition of the work function modifying material.
Figure 14A:
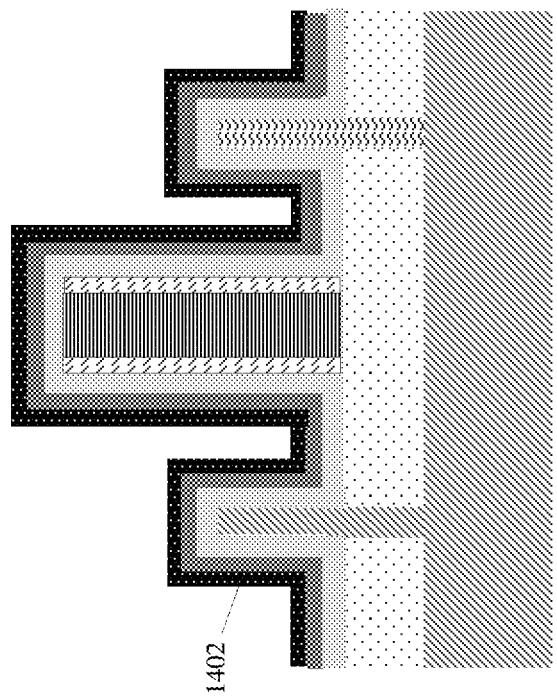
FIG. 14A is cut away view as shown in FIG. 13A after the deposition of work function material.
Figure 14B:
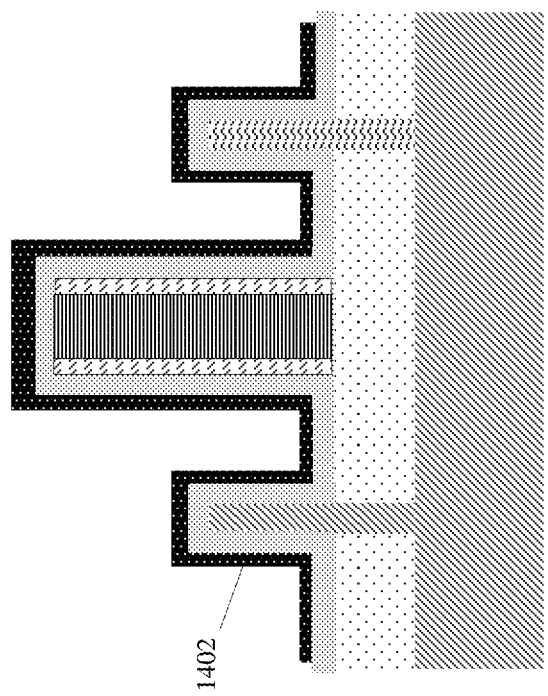
FIG. 14B is cut away view as shown in FIG. 13B after the deposition of work function material

FIG. 13A illustrates a cut-away view along the line A-A of FIG. 12 after removal of the work function modifying material. FIG. 13B illustrates a cut-away view along the line B-B of FIG. 12 after removal of the mask. Work function material 1402 is applied between the sidewalls 502 (FIG. 5) as shown in FIG. 14A and FIG. 14B. The same work function material is applied to both gate areas. Non-limiting examples of suitable work function materials ruthenium, palladium, platinum, cobalt, nickel, conductive metal oxides, hafnium, zirconium, titanium, tantalum, aluminum, metal carbides (e.g., hafnium carbide, zirconium carbide, titanium carbide, and aluminum carbide), aluminides, or any combination thereof. In some embodiments the work function material comprises titanium nitride. In some embodiments the work function material comprises titanium nitride, titanium aluminum carbide, or a combination thereof. The work function material is formed by a deposition process such as, for example, atomic layer deposition (ALD).

Figure 15:
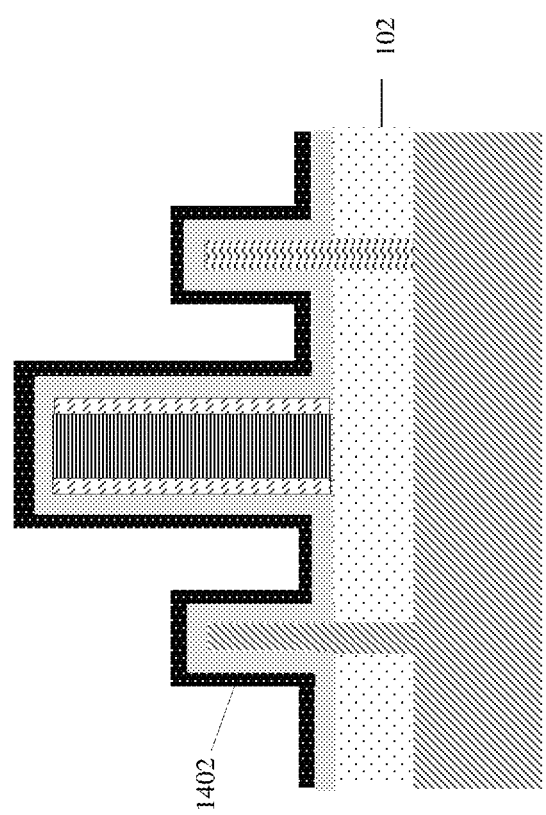
FIG. 15 is a cut away view along line A-A of FIG. 10 after deposition of the work function modifying material.
Figure 16:
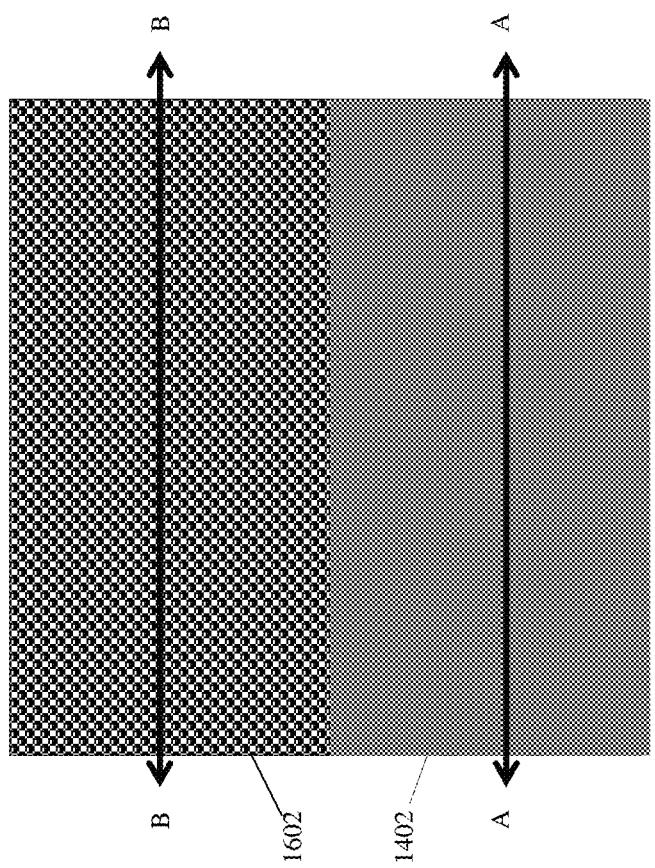
FIG. 16 is a top view after a mask is applied to the device of FIG. 15.

FIG. 15 illustrates an alternate method of making the device. FIG. 15 shows the result of work function material being applied to the device of FIGS. 11a and 11b. The same work function material is applied to both gate areas. Work function modifying material is then applied to both gate areas and a mask is applied to one gate area on the work function modifying material. FIG. 16 illustrates a top view following the formation of a block mask 1602 over a portion of the dielectric material layer 1002 and gate area. Work function modifying material is then removed from the exposed portion as shown in FIGS. 17A and B.

After the work function material and work function modifying material are in place the remaining gate cavity is filled with a low resistance material and planarized down to at least the top surface of insulator layer 702. This results in gate stacks over fins 104 and 106 which are physically separate.

A conductive metal is deposited over the high-k dielectric material(s) and work function material(s) and work function modifying material(s) to form the gate stacks. Non-limiting examples of suitable conductive metals include aluminum, platinum, gold, tungsten, titanium, or any combination thereof. The conductive metal may be deposited by a known deposition process, for example, CVD, PECVD, PVD, plating, thermal or e-beam evaporation, sputtering, or sputtering.

Figure 18:
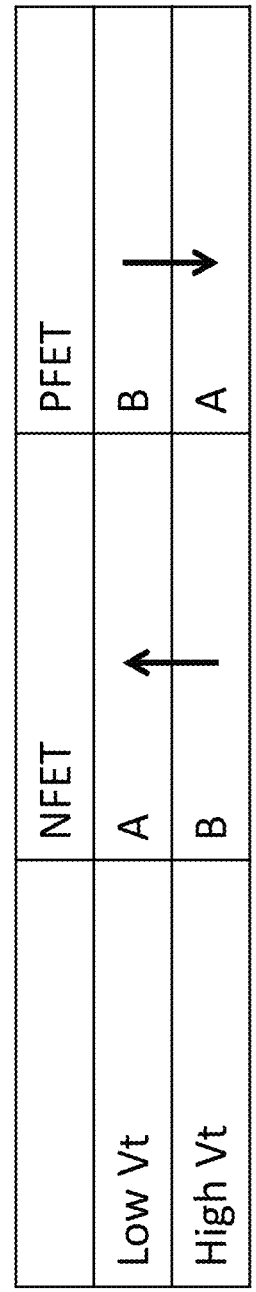
FIG. 18-20 are representations of the effect of a work function modifying material on work function and voltage.

FIG. 18 is a representation of the effect of a work function modifying material on nFET and pFET voltages. The relationship between work functions and materials is shown in Table 1.

TABLE 1

| Work function | Gate material |
| --- | --- |
| A | Work function material and work function modifying material |
| B | Work function material |

Figure 19:
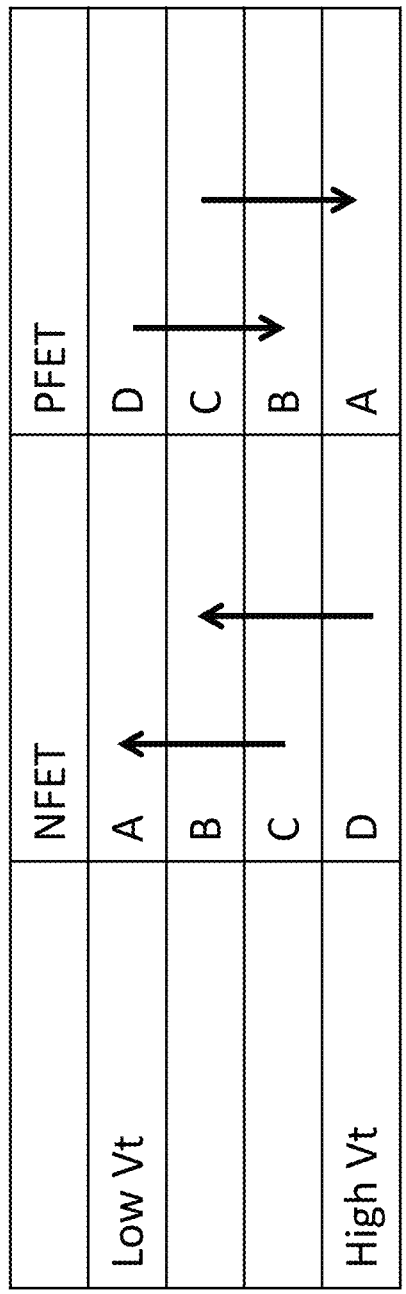

FIG. 19 is a representation of the effect of using two work function materials with a work function modifying material. The relationship between work functions and materials is shown in Table 2.

TABLE 2

| Work function | Gate material |
| --- | --- |
| C | First work function material |
| D | Second work function material |
| A | First work function material and work function modifying material |
| B | Second work function material and work function modifying material |

Figure 20:
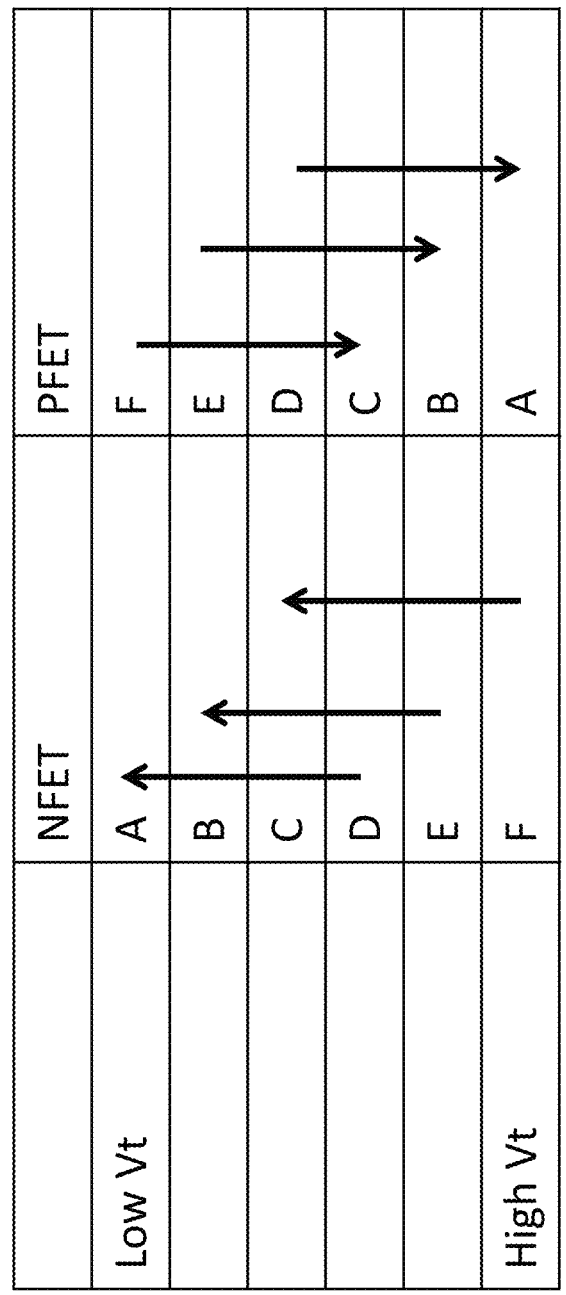

FIG. 20 is a representation of the effect of using three work function materials with a work function modifying material. The relationship between the work functions and the gate materials is shown in Table 3.

TABLE 3

| Work function | Gate material |
| --- | --- |
| D | First work function material |
| E | Second work function material |
| F | Third work function material |
| A | First work function material and work function modifying material |
| B | Second work function material and work function modifying material |
| C | Third work function material and work function modifying material |

As can be seen from FIGS. 18-20 the appropriate choice of materials can yield a device menu with a range of threshold voltages without doping.

In some embodiments, a nanowire or stacked nanowires (not shown) are patterned in the substrate 103 to form a nanowire device. Yet, in other embodiments, the devices formed by the disclosed processes are planar devices. In some embodiments, the gate stack may further comprise a dielectric cap layer (not shown) on top of the gate stack.

Embodiments of the present invention provide methods of making semiconductor devices with multiple threshold voltages without doping. The method comprises using a work function modifying material in combination with the gate electrode to achieve a work function different from the gate electrode alone.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device comprising:
    forming a first channel region of the device comprising a first channel region material and a second channel region of the device comprising a second channel region material;
    disposing a gate dielectric on the first channel region and second channel region;
    depositing a work function modifying material such that the work function modifying material is in contact with the gate dielectric disposed on the first channel region and the second channel region;
    disposing a mask over the work function modifying material deposited on the gate dielectric disposed on the first channel region;
    removing the work function modifying material from the unmasked gate dielectric disposed on the second channel region;
    removing the mask from the work function modifying material deposited on the gate dielectric disposed on the first channel region;
    forming a first gate electrode on the work function modifying material deposited on the first channel region and forming a second gate electrode on the gate dielectric disposed on the second channel region; wherein:
    the first gate electrode and the second gate electrode comprise the same single work function material;
    forming an insulator layer between the first channel region and the second channel region, wherein a first portion of the insulator layer includes the work function material and a second portion of the insulator layer includes the work function material and the work function modifying material.

2. The method of claim 1, wherein the first channel region material has a valence band edge that is dissimilar from a valence band edge of the second channel region material.

3. The method of claim 1, wherein the first channel region material has a conduction band edge that is dissimilar from a conduction band edge of the second channel region material.

4. The method of claim 1, wherein the work function modifying material is lanthanum oxide.

5. The method of claim 1, wherein the insulator layer does not extend into a horizontal insulator layer.

6. The method of claim 1, wherein the insulator layer extends upward from the horizontal insulator layer.

7. The method of claim 1, wherein the first channel region and the second channel region extends through the horizontal insulator layer.

\* \* \* \* \*